ELECTRICAL COMPONENT ASSEMBLY APPARATUS

INVENTORS
CARL F. CARLZEN
ROBERT W. HELDA
WILLIAM L. LEHNER
BY
Robert E. Strauss
ATTORNEY

ELECTRICAL COMPONENT ASSEMBLY APPARATUS

Filed Feb. 7, 1957 3 Sheets-Sheet 2

INVENTORS
CARL F. CARLZEN
ROBERT W. HELDA
WILLIAM L. LEHNER
BY
Robert E. Strauss
ATTORNEY INVENTORS
CARL F. CARLZEN
ROBERT W. HELDA
WILLIAM L. LEHNER
BY
Robert E. Stransen
ATTORNEY

United States Patent Office 2,921,316

Patented Jan. 19, 1960

2,921,316

ELECTRICAL COMPONENT ASSEMBLY APPARATUS

Carl F. Carlzen, Buffalo, Robert W. Helda, Cheektowaga, and William L. Lehner, Snyder, N.Y., assignors, by mesne assignments, to Sylvania Electric Products Inc., Wilmington, Del., a corporation of Delaware Application February 7, 1957, Serial No. 638,820

6 Claims. (Cl. 1—210)

This invention relates to an apparatus for assembling electrical components having leads extending therefrom upon circuit chassis panels, and more particularly to an apparatus of this type having a device adapted to form the leads after the components have been positioned upon the panel.

Manufacturers of electrical apparatus are using an ever increasing number of chassis panels having the circuit conductors arranged in a prescribed manner upon an insulating board. One type of panel so utilized comprises a strip of insulating material with circuit conductors attached to one side thereof. The panels may be fabricated with appropriately positioned apertures so that the leads of the electrical components, which are positioned on the side of the panel opposite to the conductors, may extend therethrough and be electrically connected to the conductors. The connection may be accomplished by bending the leads adjacent the conductors and subsequently soldering them in this position.

The apparatus for clinching or forming the leads of an electrical component adapted to be employed with a printed circuit board generally utilizes an anvil having inclined surfaces which operate on the ends of the component leads extending through the board to bend them to a position relative to the conductors. During the clinching operation, the anvil may move substantially parallel to the leads or it may rotate to wipe the leads by a swinging movement.

The above described types of lead forming apparatus do not provide adequate means for maintaining the leads in properly aligned relationships so that the clinching operation will be equally effective on each of the leads. This condition is desirable to achieve proper positioning of the component upon the panel and to insure reliable solder connections between the leads and the panel conductors. In addition, the above described apparatus does not have means for forming the leads so that an adequate structural support for the component is provided. It is important that the component be mounted and maintained in an erect or otherwise properly disposed position so that there is no interference with subsequently mounted closely spaced components. The component support requirements are especially critical when the form of the component is such that the area of contact with the chassis panel is small. A disc capacitor having laterally extending leads is one example of an electrical component which is difficult to assemble and maintain in position.

Accordingly, an object of the invention is the provision of an improved component assembly apparatus having a lead forming device operable to satisfy the requirements mentioned above.

A further object is the provision of a lead forming device operable to coin the component leads and thereby achieve an improved component support.

Another object is the provision of an apparatus for forming component leads relative to a circuit conductor to improve the reliability of a solder connection therebetween.

A further object of the invention is the provision of an appartus which aligns the component leads prior to the lead forming operation.

A still further object is the provision of a component lead forming device adjustable relative to the chassis panel to accommodate assembly of components having lead wires of different diameters.

Still another object of the invention is the provision of a component lead forming device adjustable relative to the chassis panel to accommodate assembly of components disposed at different positions relative to a given panel axis.

The foregoing objects are achieved in one aspect of the invention by the provision of an apparatus for operating on the component leads which have been positioned upon an electrical chassis panel comprising rotatable means for aligning and forming the leads whereby the leads are bent relative to the panel.

For a better understanding of the invention, reference is made to the following description taken in conjunction with the accompanying drawings in which.

Figure 1:
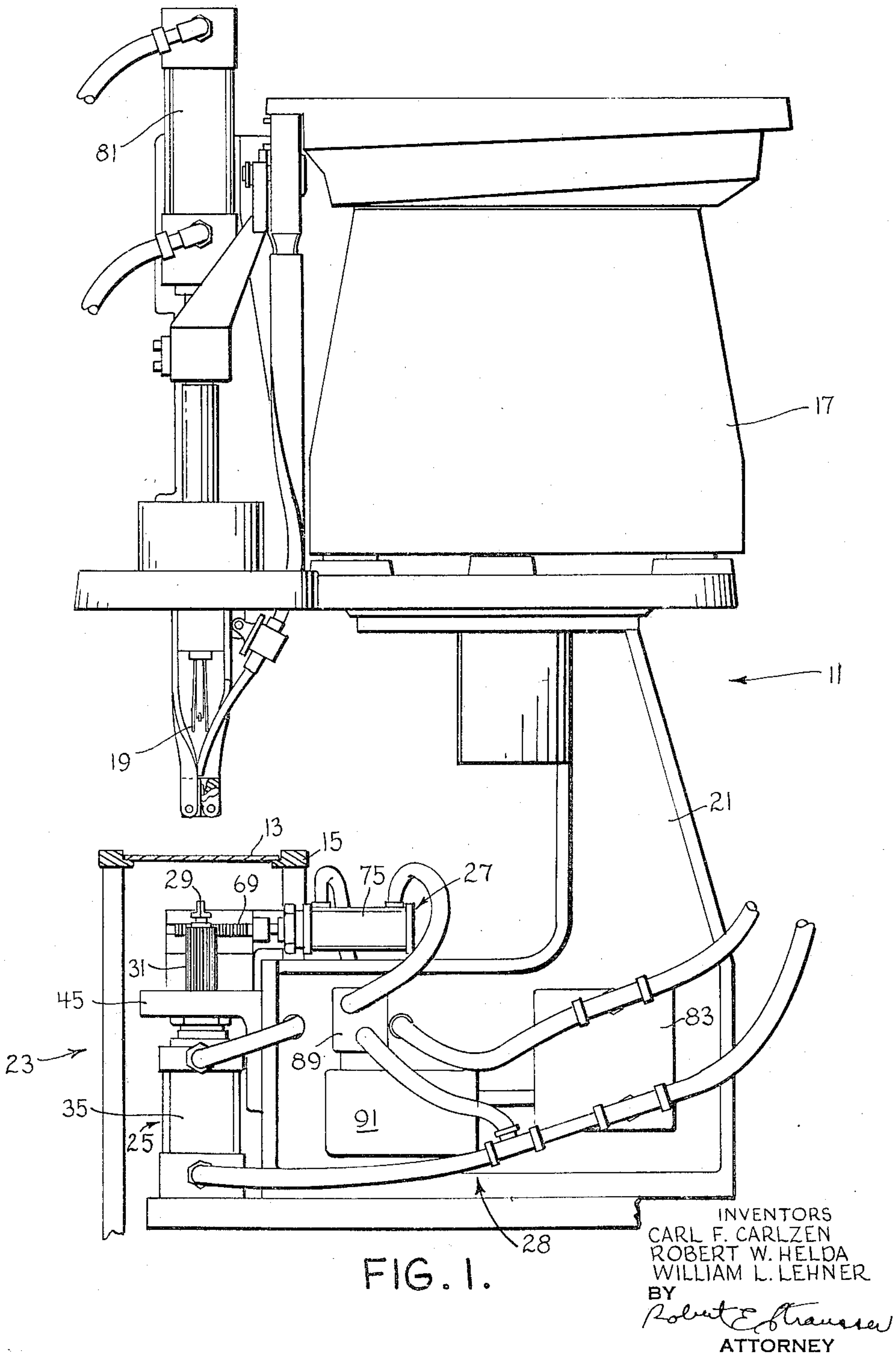
Fig. 1 is a plan view of a component assembly apparatus.
Figure 2:
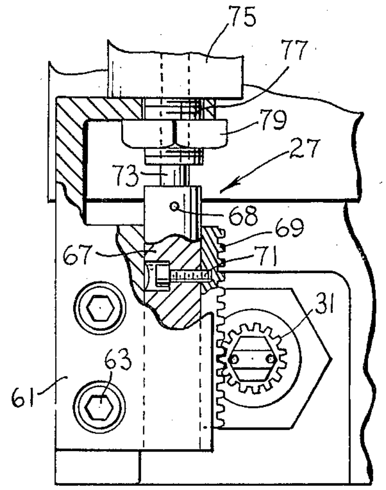
Fig. 2 is a top view of the lead forming device employed with the apparatus shown in Fig. 1.

Referring to the drawings, an apparatus 11 is shown for assembling electrical components upon an electrical chassis panel 13. The apparatus operates to sequentially mount components such as disc-shaped capacitors upon panel 13, which may be of the printed circuit type. Apertures are generally formed in the panel to allow passage of the leads therethrough to facilitate an electrical connection with the printed circuit conductors. The panel is carried along an intermittently moving conveyor 15 of the type shown and described in copending application S. N. 454,964, Automatic Assembly Apparatus, filed September 9, 1954, and assigned to the same assignee as the present invention.

Apparatus 11 has a component dispenser 17 and a component positioning head 19 mounted upon the upper portion of a substantially C-shaped frame 21. The dispenser operates to sequentially deposit electrical components within the reciprocatingly mounted head 19, which functions to position a component upon panel 13 during the downward movement thereof. The apparatus thus far described is of the type shown and described in copending application S. N. 618,011, Assembly Apparatus, filed October 24, 1956, and assigned to the same assignee as the present invention.

A lead forming device 23 is mounted upon the lower portion of frame 21. This device operates on the component leads extending through the panel apertures to form them beneath panel 13. This device has an anvil 29 formed with apertures for receiving the ends of the component leads extending therein. The anvil rotates to bend the leads beneath the board in a manner to be hereafter described. Although circuit boards of the type having appropriately positioned apertures are illustrated, it is to be understood that device 23 is adapted to operate upon any type of circuit chassis which has a construction requiring a conductor or component lead forming operation to be performed for the purpose of accomplishing an electrical connection between the component and the circuit conductor, or for the purpose of placing these circuit elements in a form to enhance a solder connection.

Device 23 is shown comprising a vertically reciprocating mechanism 25, a horizontally reciprocating mechanism 27 and translating means 28 for imparting the reciprocating movement to these mechanisms.

Figure 3:
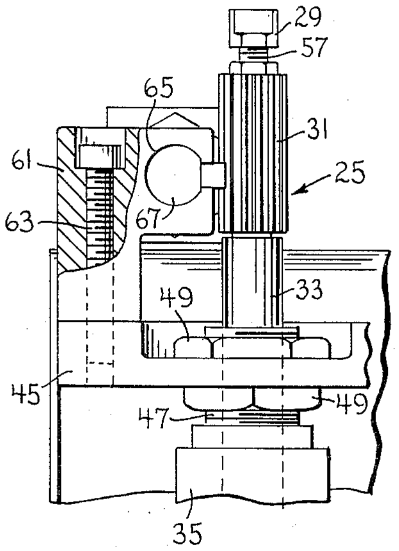
Fig. 3 is a front view of the apparatus shown in Fig. 2.
Figure 4:
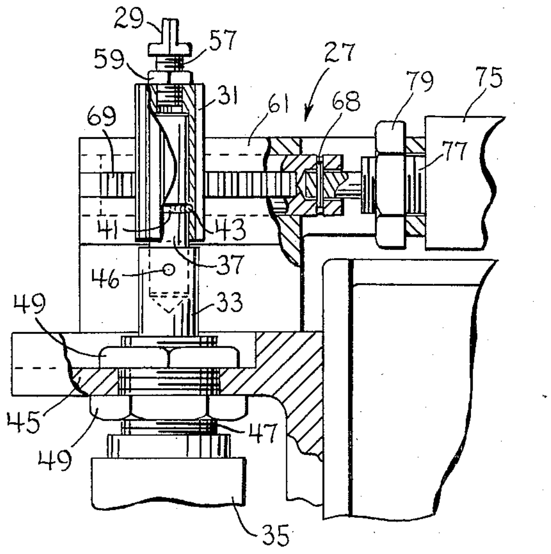
Fig. 4 is a side view of the apparatus shown in Fig. 3.

Referring particularly to Figs. 1, 3 and 4, the vertically reciprocating device 25 comprises an anvil 29 mounted upon pinion 31, which is formed with a plurality of radially disposed teeth. The pinion is affixed to the piston shaft 33 of a double acting air cylinder or actuator 35 by means of connector bar 37. A radial slot 41 is provided in the surface of the rod to cooperate with ring 43, which is disposed on the internal face of pinion 31. The lower portion of the rod is connected to the shaft 33 by virtue of pin 46. It can be seen that this construction provides a rigid vertical mounting for pinion 31 and rod 37 while allowing the pinion to rotate about the rod.

Actuator 35 is mounted upon frame 21 by a bracket 45 and is provided with an externally threaded sleeve 47. Lock nuts 49 are positioned against the opposite surfaces of bracket 45 to affix the sleeve and actuator 35 to the bracket. Accordingly, the limit of vertical movement of anvil 29 relative to panel 13 may be adjusted with proper manipulation of nuts 49 and sleeve 47 to raise or lower the sleeve and actuator. This type of versatility allows anvil 29 to reach an optimum position for properly forming lead wires of different diameters.

Figure 5:
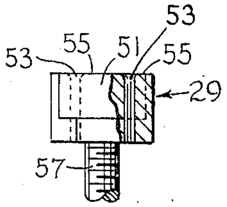
Fig. 5 is a partially sectioned plan view of the anvil used in conjunction with the apparatus shown in the drawings.

Referring to Figs. 4 and 5, anvil 29 is shown comprising a block 51 formed with apertures 53 for receiving the component leads. The edges of the apertures bordering the top or lead forming surfaces 55 of the block are rounded to prevent the leads from being severed or catching at the ends of the apertures when anvil 29 is rotated. The block 51 is secured to a shaft 57 having micrometer screw threads cut into the external surface thereof for cooperation with lock nut 59 and threads provided on the internal surface of pinion 31. Therefore, by proper manipulation of nut 59, the anvil 29 may be rotated and positioned so that it can operate upon the leads of components disposed along different axes relative to a given panel axis. This type of orientation versatility makes it possible to form component leads arrayed in any position from 0° to 360° on the chassis panel. A fine height adjustment for the anvil may also be obtained by rotation of anvil 29.

The horizontally reciprocating device 27 is mounted upon guide block 61, which is in turn affixed to bracket 45 by bolts 63. The guide block is provided with an aperture 65 serving as a guide-way for a shaft 67, which has rack 69 attached thereto by means of bolts 71. The reciprocating shaft 67 is connected to piston rod 73 of the double acting air pressure cylinder or actuator 75 by pin 68.

An externally threaded sleeve 77 is connected to actuator 75 to provide attachment thereof to block 61 by means of nut 79. The teeth of rack 69 are continually meshing with the teeth of pinion 31. Therefore, the rack teeth provide a vertical guide track for the pinion in addition to imparting rotational movement thereto upon operation of actuator 75.

After conveyor 15 has moved a chassis panel 13 into the assembly position and stopped, the head 19 proceeds to move down and place the component upon the panel. The anvil 29 is moved upwardly to a position beneath the panel prior to or at approximately the same time as the component leads are inserted through the panel apertures. These movements provide an opportunity to have the component leads properly aligned during insertion. The component leads slip into the anvil apertures 53, which have a larger diameter than the leads, to afford the desired alignment and support for the component prior to and during the lead forming operation.

Figure 6:
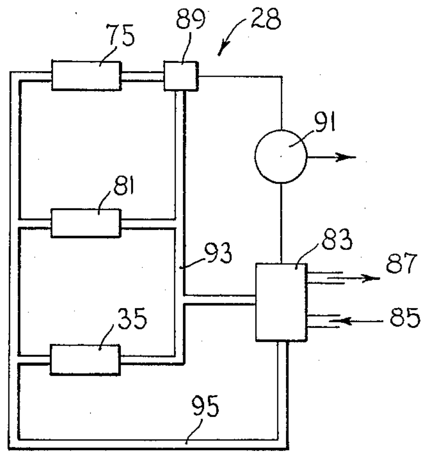
Fig. 6 is a diagram of the translating means providing the movements for the assembly apparatus.

Referring to Figs. 1 and 6, translating means 28 comprise the lead forming device actuators 35 and 75, and a double acting air cylinder or actuator 81 which provides reciprocating movement to head 19. These actuators are connected to an electrically operated main air pressure valve 83, which has air inlet and outlet ports 85 and 87 respectively. An electrically operated valve 89 interconnects actuator 75 with main valve 83. An electrical device 91 is connected to a master timer (not shown) which serves an entire production line of machines of the type illustrated herein. Device 91 signals valves 83 and 89 to effect their operation at the appropriate time.

At the offset of the machine movements, air pressure is first supplied through line 85 and valve 83 to line 93 and then to actuators 35 and 81 and to valve 89. This operation causes head 19 and anvil 29 to move to their oppositely disposed positions adjacent panel 13. An electrical pulse from device 91 then causes valve 89 to supply actuator 75 with pressure, which operates to move rack 69 outwardly and rotate pinion 31 with its attached anvil 29. Subsequently, electrical device 91 signals valve 83 to reverse the pressure through line 95 and to return the actuators 35, 75, and 81 to their retracted positions. If desired, a valve of the type indicated by the numeral 89 could be provided on the opposite side of actuator 75 to delay operation thereof until anvil 29 has retracted a distance away from panel 13.

Figure 7:
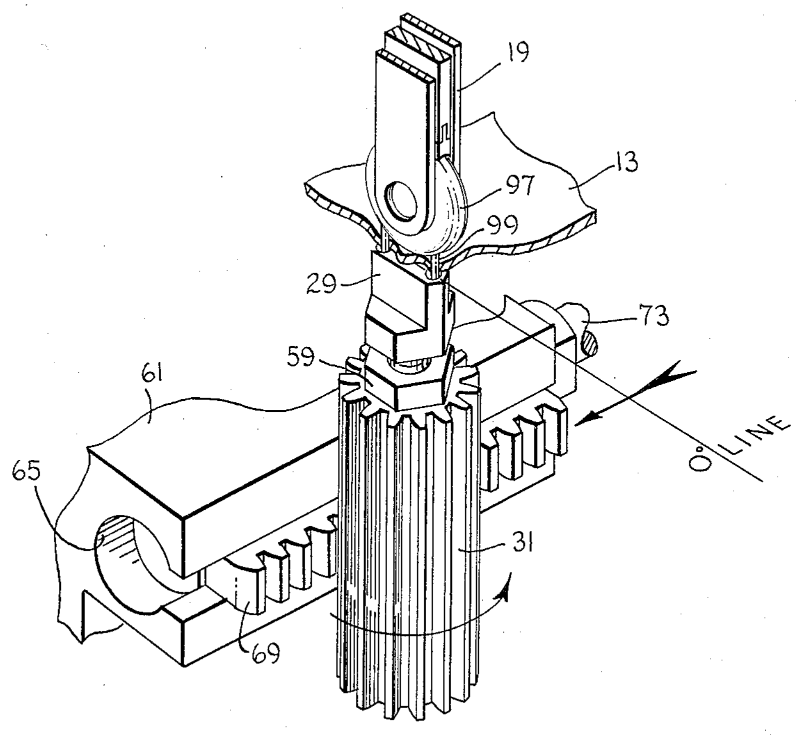
Fig. 7 is a perspective view of certain portions of the lead forming mechanism.
Figure 8:
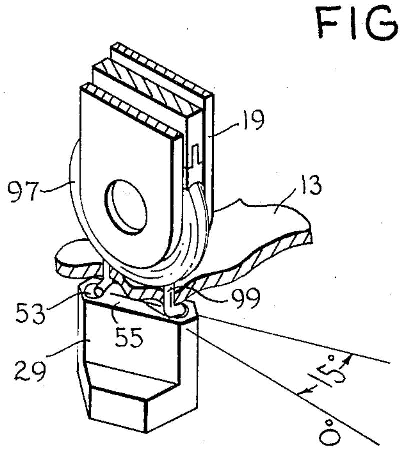
Figs. 8 and 9 illustrate in perspective the manner in which an electrical component is assembled upon a chassis panel by the apparatus shown in the preceding figures.
Figure 9:
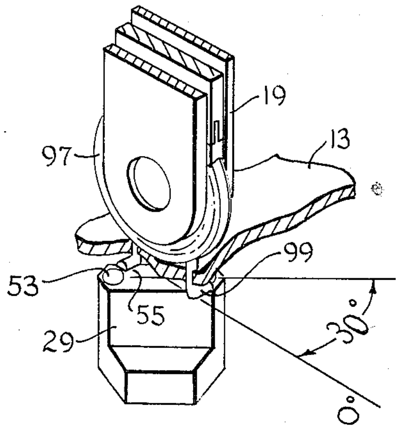

Figs. 7, 8 and 9 illustrate the manner in which an electrical component such as the disc capacitor 97 is assembled upon panel 13. Head 19 moves the component down to the panel and the leads 99 are threaded through the panel apertures and into the apertures 53 of anvil 29. The upward travel of the anvil is guided by means of the cooperation between the meshing teeth of rack 69 and pinion 31. The limit of vertical travel of the anvil is at a position spaced from the panel a distance less than the diameter of leads 99. Actuator 75 then causes rack 69 to move outwardly and rotate pinion 31 and anvil 29 to thereby cause the leads to be formed under the panel. During the first portion of rotative movement, which is approximately 15°, the side walls and rounded edges of apertures 53 cause the leads to be bent in opposite directions. Since the leads are trapped within the apertures during this operation, there is no opportunity for them to move in any manner other than along the prescribed path. This type of guided lead forming operation is advantageous, especially with components shaped like disc capacitors 97, since the leads must be approximately equally and uniformly bent to insure a rigid erect support after head 19 moves upwardly.

As described above, the lead forming surfaces 55 of anvil 29 are spaced from panel 13 at a distance less than the diameter of leads 99. Therefore, during the remainder of the rotational movement of anvil 29, which is approximately 15°, the lead forming surfaces 55 operate on the leads to coin them upon the lower surface of panel 13. This coining operation causes the leads to be permanently bent into position so that they do not spring back from the panel. Accordingly, the component 97 is rigidly affixed to panel 13 in an erect position, since the component body is touching the opposite side of the panel.

Although anvil 29 is shown to be rotated through an arc of 30°, it is to be understood that the angle of rotation needed for adequately forming the leads is dependent upon the type of component and the diameter, composition of material, and length of the lead wires.

After the component 97 has been assembled upon panel 13, actuators 35, 75 and 81 reverse the movements of anvil 29, rack 69 and head 19 so as to position these machine elements in readiness for the subsequent component assembly operation. The rack may be retracted at the same time as anvil 29 is moved down, since the reverse motion of the anvil does not affect the coined leads. If desired, an appropriate valve may be used in conjunction with actuator 75 as herebefore described to delay the action of the rack until the anvil has cleared the component leads.

Although certain embodiments of the invention have been shown and described, it will be apparent to those skilled in the art that various changes and modifications may be made therein without departing from the scope of the invention as defined by the appended claims.

What is claimed is:

1. An apparatus for forming the leads of an electrical component positioned upon a chassis panel comprising anvil means having lead forming surfaces for operating on said leads, means for moving said anvil means to a position spaced from said panel, and means for rotating said anvil means to provide movement of said lead forming surfaces along a path spaced from said panel less than the diameter of said leads whereby the leads are operated on by said lead forming surfaces and coined and bent relative to said panel.

2. An apparatus for forming the leads of an electrical component positioned upon a chassis panel comprising anvil means for operating on said leads, means for moving said anvil means to a position spaced less than the diameter of said leads from said panel, and means for rotating said anvil means whereby the leads are coined and bent relative to said panel.

3. An apparatus for forming the leads of an electrical component positioned upon a chassis panel comprising anvil means for operating on said leads, means for moving said anvil means to a position spaced less than the diameter of said leads from the panel, means for adjusting the limit of said movement in accordance with the diameter of said leads, and means for rotating said anvil means whereby the leads are coined and bent relative to said panel.

4. An apparatus for forming the leads of an electrical component positioned upon a chassis panel comprising anvil means having apertures for receiving the leads and lead forming surfaces, means for moving said anvil means to a position whereat the lead forming surfaces are spaced less than the diameter of said leads from said panel, and means for rotating said anvil means whereby the leads are operated upon by said anvil and formed to lie substantially along the surface of said panel.

5. An apparatus for forming the leads of an electrical component positioned upon a chassis panel comprising anvil means having lead forming surfaces and apertures for receiving and positioning the leads substantially in alignment relative to one another, means for moving said anvil means to a position whereat the lead forming surfaces are spaced less than the diameter of said leads from said panel, and means for rotating said anvil means whereby the leads are operated upon by said anvil and formed to lie substantially along the surface of said panel.

6. An apparatus for forming the leads of an electrical component positioned upon a chassis panel comprising a reciprocating pinion gear, an anvil having lead forming surfaces mounted upon said pinion gear for operating on the leads, means for moving said pinion gear to a position whereat said anvil is disposed in operating relationship with the leads, a rack having gear teeth continuously meshing with the pinion gear for guiding the reciprocating travel of said pinion gear, and means for moving said rack to provide rotation of said pinion gear and anvil whereby the component leads are formed by operation thereupon by said lead forming surfaces.

References Cited in the file of this patent

UNITED STATES PATENTS 2,746,041 Heeley ---------------- May 22, 1956